United States Patent
Ko

(10) Patent No.: US 7,958,415 B2
(45) Date of Patent: Jun. 7, 2011

(54) SEMICONDUCTOR INTEGRATED CIRCUIT AND METHOD OF DETECTING FAIL PATH THEREOF

(75) Inventor: Bok Rim Ko, Ichon (KR)

(73) Assignee: Hynix Semiconductor Inc. (KR)

( * ) Notice: Subject to any disclaimer, the term of this patent is extended or adjusted under 35 U.S.C. 154(b) by 558 days.

(21) Appl. No.: 11/958,333

(22) Filed: Dec. 17, 2007

(65) Prior Publication Data

US 2009/0006914 A1 Jan. 1, 2009

(30) Foreign Application Priority Data

Jun. 27, 2007 (KR) .................. 10-2007-0063834

(51) Int. Cl.
  *G11C 29/02* (2006.01)
  *G11C 29/54* (2006.01)
(52) U.S. Cl. ........................................ 714/719; 714/733
(58) Field of Classification Search ........................ None
  See application file for complete search history.

(56) References Cited

U.S. PATENT DOCUMENTS

| 5,483,493 | A | 1/1996 | Shin |
| 6,064,625 | A * | 5/2000 | Tomita ................ 365/233.11 |
| 6,163,863 | A | 12/2000 | Schicht |
| 6,604,058 | B2 | 8/2003 | Nakayama |
| 6,989,551 | B2 | 1/2006 | Gunther et al. |
| 7,508,695 | B2 * | 3/2009 | Sugita ................... 365/148 |
| 2004/0205429 | A1 * | 10/2004 | Yoshida et al. ........... 714/718 |
| 2006/0212777 | A1 * | 9/2006 | Hirao .................... 714/763 |
| 2006/0236178 | A1 * | 10/2006 | Satsukawa et al. ....... 714/726 |

FOREIGN PATENT DOCUMENTS

| JP | 2000292495 | 10/2000 |
| JP | 2000322898 | 11/2000 |

* cited by examiner

*Primary Examiner* — Jeffrey A Gaffin
*Assistant Examiner* — Dipakkumar Gandhi
(74) *Attorney, Agent, or Firm* — Baker & McKenzie LLP

(57) ABSTRACT

Disclosed is a semiconductor integrated circuit that allows a fail path to be detected. A semiconductor integrated circuit as described herein can be configured to include a data register that can receive input data to generate and store a write expectation value and a read expectation value, during a period in which a test mode is activated, a first comparing unit that compares write data written in a memory cell with the write expectation value, and a second comparing unit that compares read data read from the memory cell with the read expectation value.

25 Claims, 4 Drawing Sheets

SEMICONDUCTOR INTEGRATED CIRCUIT AND METHOD OF DETECTING FAIL PATH THEREOF

CROSS-REFERENCES TO RELATED APPLICATION

The present application claims priority under 35 U.S.C. 119(a) to Korean Patent Application number 10-2007-0063834, filed on Jun. 27, 2007, in the Korean Intellectual Property Office, the contents of which are incorporated herein by reference in their entirety as if set forth in full.

BACKGROUND

1. Technical Field

The disclosure relates to a semiconductor integrated circuit, and more particularly, to a semiconductor integrated circuit in which a failure path can be detected.

2. Related Art

After a semiconductor integrated circuit is fabricated, it is tested using a predetermined test apparatus to determine whether the semiconductor integrated circuit operates normally. Specifically, in order to test the semiconductor integrated circuit, a test process is performed in which data that is provided by a tester is written in a memory cell and the written data is read back out. If the data read out is not the same as the data written during the test, then the semiconductor integrated circuit is not operating normally. Therefore, a failure path analyzing process needs to be performed in order to detect the failure path.

However, there are a lot of possible failure paths in many conventional semiconductor integrated circuits, due to the numerous circuits included in today's semiconductor integrated circuits. The increased analysis time means that productivity and efficiency are lowered.

SUMMARY

A semiconductor integrated circuit that allows a failure path to be detected quickly and efficiently is described herein. According to one aspect, a semiconductor integrated circuit can include a data register that can be configured to receive input data to generate and store a write expectation value and a read expectation value, during a period in which a test mode is activated. The data register can also include a first comparing unit that is configured to compare write data written in a memory cell with the write expectation value, and a second comparing unit configured to compare read data read from the memory cell with the read expectation value.

According to another aspect, a semiconductor integrated circuit can include a data register that can be configured to receive input data provided from a data input buffer to generate and store a write expectation value and a read expectation value, during a period in which a test mode is activated. The data register can also include a first comparing unit configured to compare the write expectation value with write data received by a write driver to output a first detection signal, thereby detecting whether a fail occurs on a path between the data input buffer and the write driver, and a second comparing unit configured to compare the read expectation value with read data provided from a data sense amplifier to output a second detection signal, thereby detecting whether a failure occurs on a path between the write driver and the data sense amplifier.

According to another aspect, a semiconductor integrated circuit can include a detecting block that can receive input data and store the input data as a write expectation value and a read expectation value when a test mode is activated, and can detect a fail occurrence in the semiconductor integrated circuit by comparing write data written in a memory cell with the write expectation value and determine whether the write data and the write expectation value are coincided with each other, and by comparing read data read from the memory cell with the read expectation value determine whether the read data and the read expectation value are the same, thereby narrowing a failure path analysis range.

According to still another aspect, there is provided a method of detecting a failure path of a semiconductor integrated circuit. The method includes receiving input data and generating a write expectation value and a read expectation value, during a period in which a test mode is activated, comparing write data written in a memory cell with the write expectation value to output a first detection signal, thereby determining whether a failure occurs, and comparing read data read from the memory cell with the read expectation value to output a second detection signal, thereby determining whether a failure occurs.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
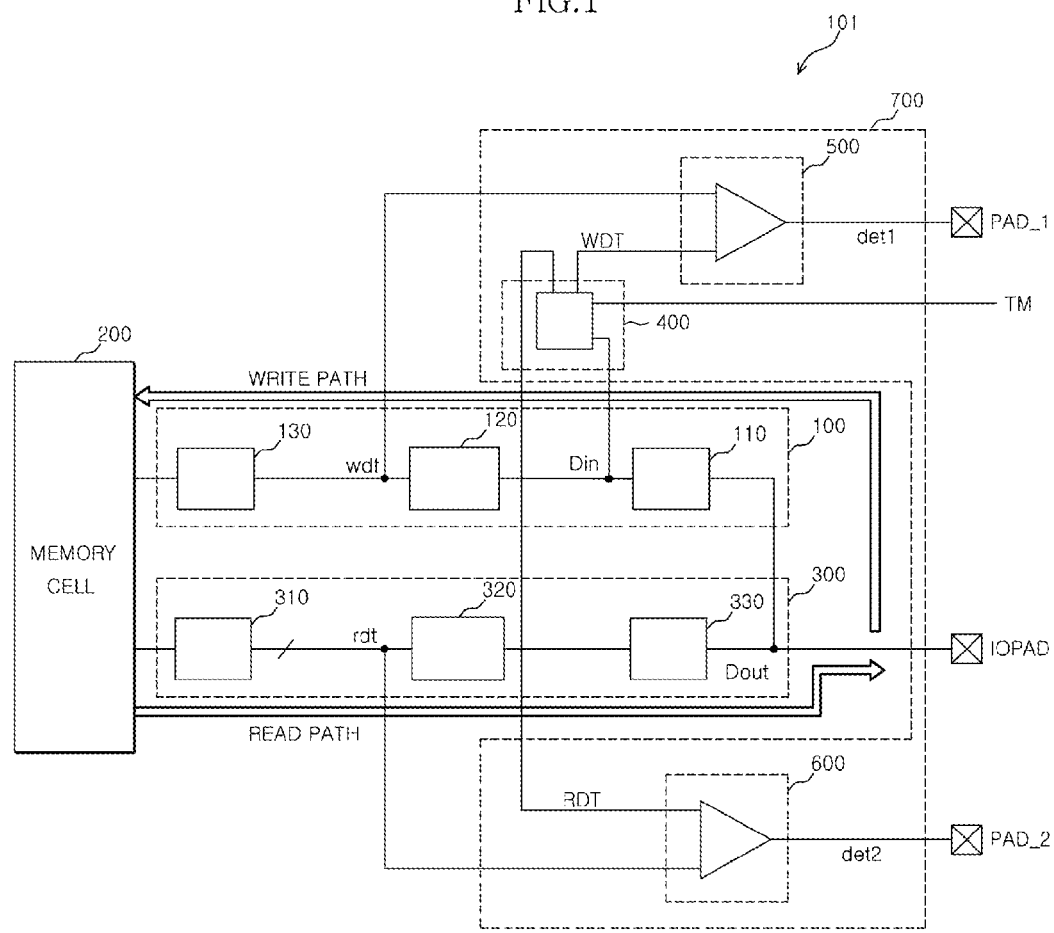
FIG. 1 is a block diagram illustrating a semiconductor integrated circuit according to an embodiment.

FIG. 1 is a block diagram illustrating a semiconductor integrated circuit 101 according to one embodiment of the. Referring to FIG. 1, the semiconductor integrated circuit 101 can be configured to include a write control block 100, a memory cell 200, a read control block 300, and a detecting block 700.

Further, the write control block 100 can be configured to include a data input buffer 110, a data input storage unit 120, and a write driver 130. Specifically, the data input buffer 110 can be configured to receive data, which can be input from the outside of the semiconductor integrated circuit 101 through an input/output pad IOPAD, buffer the received data, and output input data (Din). The data input storage unit 120 can be configured to receive the input data (Din) and output the input data (Din) as write data (wdt) synchronized with a clock signal (not shown). For example, the data input storage unit 120 can be a register. The write driver 130 can be configured to carry the write data (wdt) on a global input/output line (not shown) to be written in the memory cell 200. Further, the input data (Din) and the write data (wdt) can be successive data that is related to a burst length (BL).

The read control block 300 can be configured to include a data sense amplifier 310, a pipe register 320, and a data output buffer 330. Specifically, the data sense amplifier 310 can be configured to sense a signal, which can be read from the memory cell 200 and carried on the global input/output line (not shown), and output read data (rdt). In this case, the read data (rdt) can be successive read data (rdt) that can be provided by data capacity corresponding to the burst length (BL). The pipe register 320 can be provided to account for the CAS latency (CL) and can be configured to sequentially store the read data (rdt). The data that is stored in the pipe register 320 can be output through the data output buffer 330, completing the read operation.

In a conventional semiconductor integrated circuit, the write control block 100 can be configured to write data input through the external input/output pad IOPAD, and the read control block 300 can be configured to read the data. Then, it can be determined whether the written data and the read data are the same to detect a failure. However, as discussed above, it may be difficult to detect a path associated with the failure.

Circuit 101, however, includes detecting block 700. The detecting block 700 can include a data register 400, a first comparing unit 500, and a second comparing unit 600. The data register 400, the first comparing unit 500, and the second comparing unit 600 can be configured to separate failure paths and provide a detection signal, which can narrow the range of possible failure paths.

Specifically, during a period in which a test mode is activated, the data register 400 can be configured to receive the input data (Din) and output a write expectation value (WDT) and a read expectation value (RDT). That is, the data register 400 outputs the write expectation value (WDT) and the read expectation value (RDT) in response to the test mode activation signal (TM) and the input data (Din). For example, when the input data (Din) is '0', the data register 400 can be configured to store a value of '0' as the write expectation value (WDT) and the read expectation value (RDT), which will be described in detail below.

The first comparing unit 500 can be configured to compare the write expectation value (WDT) with the write data (wdt) received in the write driver 130 and determine whether the write expectation value (WDT) and the write data (wdt) are the same. That is, if the write data (wdt) and the write expectation value (WDT) are the same, then the first comparing unit 500 can be configured to input a first detection signal (det1) to a first pad PAD_1.

The second comparing unit 600 can be configured to compare the read expectation value (RDT) with the read data (rdt), which can be sensed and output by the data sense amplifier 310, and determine whether the read expectation value (RDT) and the read data (rdt) are the same. That is, if the read data (rdt) and the read expectation value (RDT) are the same, then the second comparing unit 600 can be configured to output a second detection signal to a second pad PAD_2.

In this case, the first and second pads PAD_1 and PAD_2 can be extra pads that are not used during a test mode, but in other embodiments, other pads can be used that are not necessarily dedicated test pads. Failure path detecting pads can be provided in advance as the first and second pads PAD_1 and PAD_2. Signal levels at the first and second pads PAD_1 and PAD_2 are measured by using a test tip, which is provided outside the semiconductor integrated circuit 101, and thus, it is possible to detect whether a failure occurs according to the measured signal levels.

Figure 2:
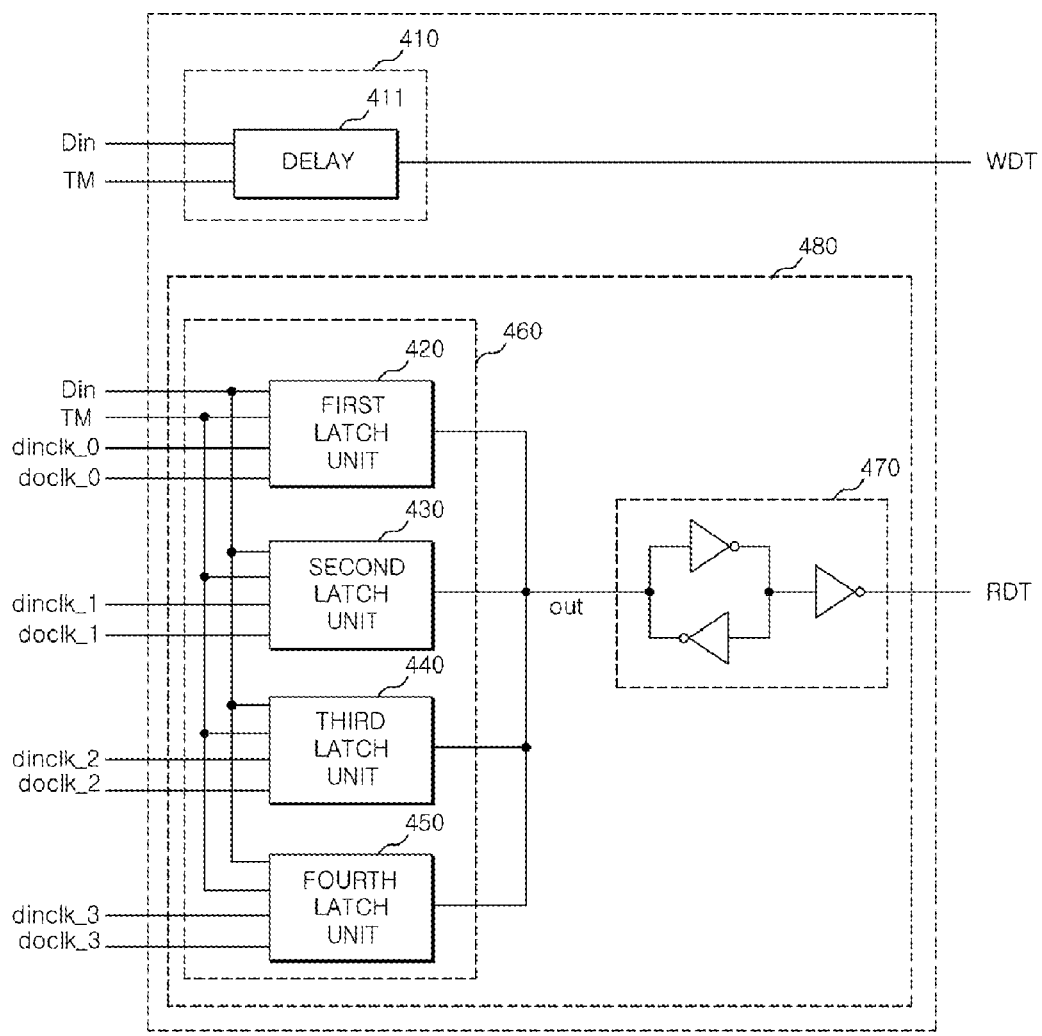
FIG. 2 is a block diagram illustrating a data storage unit that can be included in the circuit illustrated in FIG. 1.

FIG. 2 is a block diagram illustrating data register 400 in more detail. Referring to FIG. 2, the data register 400 can include a first expectation value storage unit 410 and a second expectation value storage unit 480. The first expectation value storage unit 410 can be configured to receive the test mode activation signal (TM) and the input data (Din), and output the write expectation value (WDT).

As shown in FIG. 2, the first expectation value storage unit 410 can include a delayer 411. During a period in which the test mode is activated, the delayer 411 can be configured to delay the input data (Din) for a predetermined amount of time to align a comparison timing between the write expectation value (WDT) and the write data (rdt). That is, the delayer 411 can be configured to delay the input data (Din) until the input data (Din) is input to the write driver (refer to reference numeral 130 of FIG. 1) through data input storage unit 120. Accordingly, the write expectation value (WDT) is delayed from the input data (Din) by a predetermined amount of time. The delayer 411 can include a plurality of inverter chains, but is not limited thereto. For example, the delayer 411 can include a replica circuit.

The second expectation value storage unit 480 can be configured to receive the test mode activation signal (TM), the input data (Din), data input clock signals (dinclk_0) to (dinclk_3), and data output clock signals (doclk_0) to (doclk_3), and output the read expectation value (RDT). The second expectation value storage unit 480 can include a data latch unit 460 and a transmitting unit 470. T data latch unit 460 can be configured to include a plurality of latch units 420 to 450.

The latch units 420 to 450 can be configured to latch the input data (Din) synchronized with the corresponding data input clock signals (dinclk_0) to (dinclk_3), and output the input data (Din), which can be latched with the data output clock signals (doclk_0) to (doclk_3), as an output signal out.

Meanwhile, the latch units 420 to 450 can be provided to correspond to the burst length (BL). In one embodiment, it is assumed that the burst length (BL) is 4. That is, the first latch unit 420 can be configured to latch the input data (Din) synchronized with a 0, or first, data input clock signal (dinclk_0). Then, the second latch unit 430 can be configured to latch the continuous input data (Din) synchronized with a 1, or second, data input clock signal (dinclk_1). Then, the third and fourth latch units 440 and 450 can be configured to latch the continuous input data (Din) synchronized with corresponding 2 and 3, or third and fourth, data input clock signals (dinclk_2) and (dinclk_3).

The data output clock signals (doclk_0) to (doclk_3), which can be output strobe signals that determine when the latch units 420 to 450 output the data, can be generated to correspond to the CAS latency (CL). In this case, it is assumed that the data output clock signals (doclk_0) to (doclk_3) are provided to satisfy CAS latency 3. Accordingly, the data, which can be latched by the individual latch units 420 to 450, can be sequentially output as the output signal (out) synchronized with the data output clock signals (doclk_0), (doclk_1), (doclk_2), and (doclk_3).

The transmitting unit 470 can be configured to latch the output signal (out) and output the latched signal as the read expectation value (RDT). Since the operation principles of the latch units 420 to 450 are the same, only the first latch unit 420 will be described in order to avoid repetition.

Figure 3:
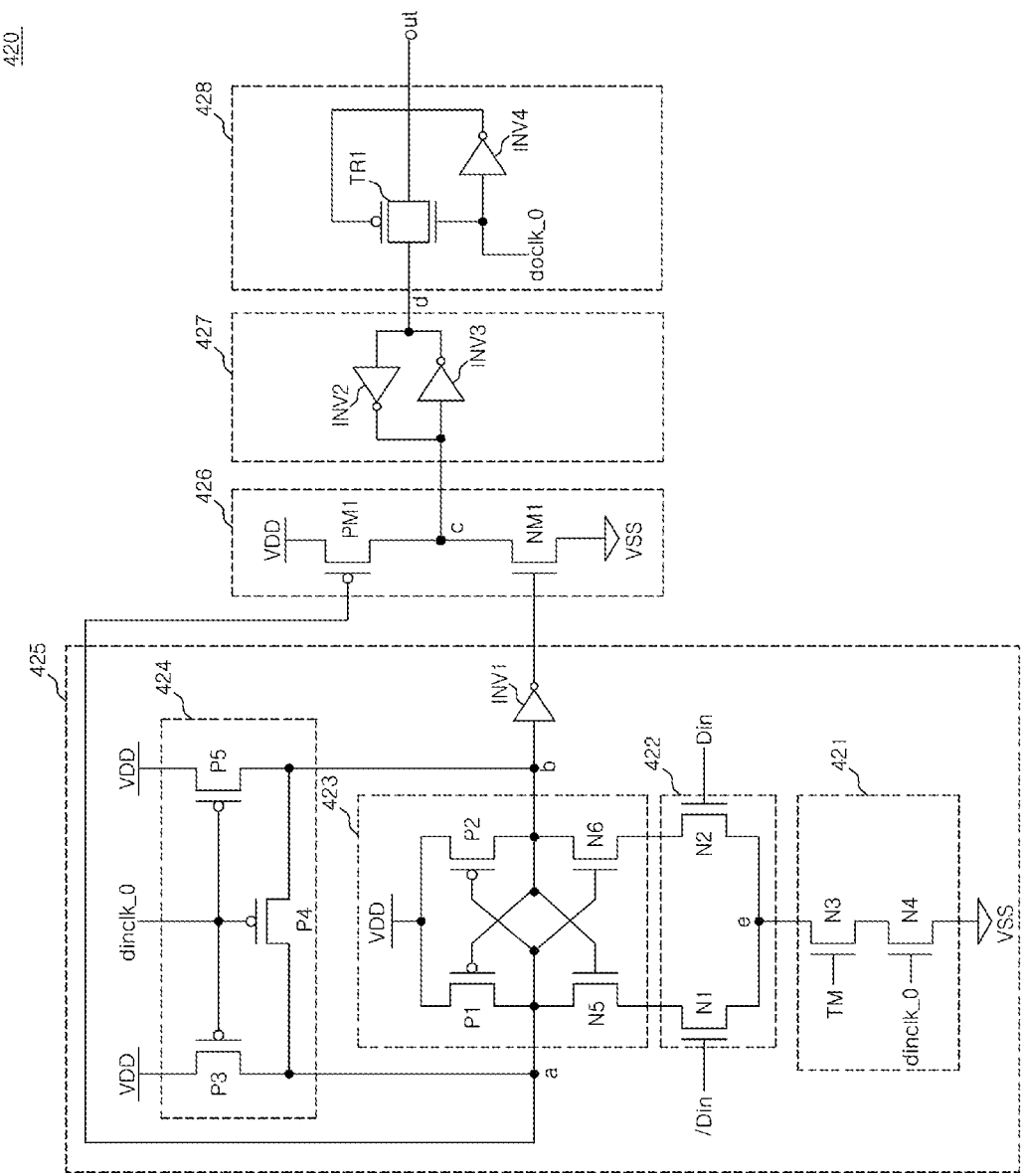
FIG. 3 is a circuit diagram illustrating a first latch unit that can be included in the circuit illustrated in FIG. 2.

As shown in FIG. 3, the first latch unit 420 can include a clock buffer unit 425, an inverting unit 426, a latch unit 427, and a transmitting unit 428. The clock buffer unit 425 can include a first control unit 421, a data receiving unit 422, an amplifying unit 423, and a second control unit 424.

First, the first control unit 421 can be configured to include third and fourth NMOS transistors N3 and N4 that are connected in series. The third NMOS transistor N3 can be configured to include a gate that receives the test mode activation signal (TM) and a drain that is connected to a node e. The fourth NMOS transistor N4 can be configured to include a gate that receives the data input clock signal (dinclk_0) and a source that is connected to a ground terminal VSS. That is, the first control unit 421 can operate by synchronizing with a rising edge of the data input clock signal (dinclk_0), while the test mode is activated.

The data receiving unit 422 can be configured to include first and second NMOS transistors N1 and N2 that can receive the input data (Din) and the inverted input data (/Din). The first and second NMOS transistors N1 and N2 can be disposed opposite to each other. Gates of the first and second NMOS transistors N1 and N2 can be configured to receive the inverted input data (/Din) and the input data (Din), respectively, and the sources thereof can be connected to the node e.

The amplifying unit 423 can provide a signal, which can be obtained by latching the difference in driving current by the data receiving unit 422, to the node b. Specifically, each of the first PMOS transistor P1 and the fifth NMOS transistor N5 can be an inverter type. A gate of each of the first PMOS transistor P1 and the fifth NMOS transistor N5 can be connected to a node b, a source of the first PMOS transistor P1 can be connected to an external power supply (VDD), and a source of the fifth NMOS transistor N5 can be connected to a drain of the first NMOS transistor N1. Each of the second PMOS transistor P2 and the sixth NMOS transistor N6, which can be disposed opposite to the first PMOS transistor P1 and the fifth NMOS transistor N5, can be an inverter type, and a gate thereof can be connected to a node a. In this way, the amplifying unit 423 has a cross-coupled latch structure.

The second control unit 424 can include third to fifth PMOS transistors P3 to P5. A gate of each of the third to fifth PMOS transistors P3 to P5 can be configured to receive the data input clock signal (dinclk_0). Sources of the third and fifth PMOS transistors P3 and P5 can be connected to the external power supply (VDD), and drains thereof can be connected to the node a and the node b, respectively. The source and drain of the fourth PMOS transistor P4 can be connected to the node a and the node b, respectively. If the second control unit 424 receives the activated data input clock signal (dinclk_0), the second control unit 424 does not operate. Meanwhile, if the second control unit 424 receives the inactive data input clock signal (dinclk_0), the second control unit 424 can output an inactive signal level to cause the inverting unit 426 not to operate. As such, the clock buffer unit 425 can be configured to compare the input data (Din) and (/Din), which can be received when the data input clock signal (dinclk_0) is active, to detect the current difference between the input data (Din) and (/Din), to latch the input data (Din) and (/Din).

The inverting unit 426 can include a first NMOS transistor NM1 and a first PMOS transistor PM1. The first NMOS transistor NM1 can include a gate that can receive an inverted signal of a signal at the node b, a source that is connected to the ground terminal VSS, and a drain that is connected to the node c. The first PMOS transistor PM1 can include a gate that can receive a signal at the node a, a source that is connected to the external power supply, and a drain that is connected to the node c. Therefore, the inverting unit 426 can be configured to receive the signal at the node a and the inverted signal of the signal at the node b, which has passed through the first inverter INV1, so that the first NMOS transistor NM1 or the first PMOS transistor PM1 can be selectively turned on. That is, according to the operation of the inverting unit 426, the inverted signals of the signals at the node a and the node b can be provided to the node c.

The signal at the node c can be inverted by the latch unit 427, and output as the output signal out through a first transmission gate TR1 of the transmitting unit 428. In this case, the latch unit 427 includes second and third inverters INV2 and INV3 that are connected to each other in a latch structure.

Meanwhile, the transmitting unit 428 can include the first transmission gate TR1 and a fourth inverter INV4. The transmitting unit 428 can output the signal at the node d by synchronizing with the active data output clock signal (doclk_0), as the output signal out. In other words, while the test mode is active, the first latch unit 420 can latch a signal according to the received result of the input data (Din) synchronized with the rising edge of the data input clock signal (dinclk_0), and output the output signal out synchronized with the data output clock signal (doclk_0). As described above with reference to FIG. 2, the next output signal out can be output as the read expectation value (RDT) through the transmitting unit (refer to reference numeral 470 in FIG. 2).

That is, the data register 400 can be configured to generate the write expectation value (WDT) or the read expectation value (RDT) in response to a data signal for a test. The write expectation value (WDT) or the read expectation value (RDT) can be generated by a simple method of temporarily storing data provided by the external tester. Therefore, the output time of the write expectation value (WDT) or the read expectation value (RDT) can be adjusted in consideration of a predetermined delay time that is needed in the write path or the read path, such that the write expectation value (WDT) or the read expectation value (RDT) can be compared with the write data or the read data that is written in the memory cell or read from the memory cell.

Figure 4A:
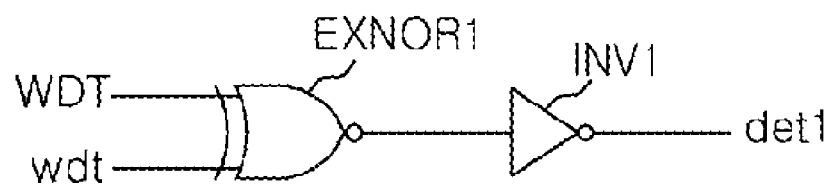
FIG. 4A is a simplified circuit diagram illustrating a first comparing unit that can be included in the circuit illustrated in FIG. 1.
Figure 4B:
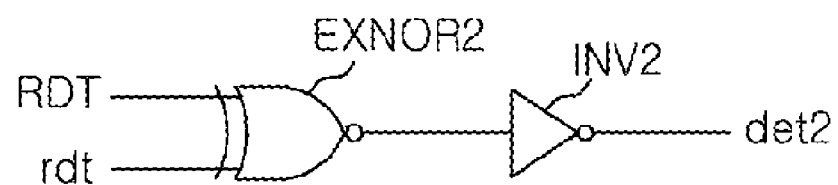
FIG. 4B is a simplified circuit diagram illustrating a second comparing unit that can be included in the circuit illustrated in FIG. 1.

FIG. 4A is a simplified circuit diagram illustrating a first comparing unit that can be included in the circuit 101 illustrated in FIG. 1. FIG. 4B is a simplified circuit diagram illustrating a second comparing unit that can be included in the circuit 101 illustrated in FIG. 1. Referring to FIGS. 4A and 4B, comparing units, which detect a fail path using the write expectation value (WDT) and the read expectation value (RDT), will be described.

First, the first comparing unit 500 can be configured to compare the write expectation value (WDT) and the write data (wdt) and can be configured to check whether the write expectation value (WDT) and the write data (wdt) are the same, as shown in FIG. 4A. The first comparing unit 500 can be configured to include a first exclusive NOR gate EXNOR1 and a first inverter IV1.

Specifically, the write expectation value (WDT) can be generated by delaying the input data (Din) in a predetermined amount of time, as described above. The predetermined amount of time is set in consideration of the time for the input data (Din) to be received by the write driver (refer to reference numeral 130 in FIG. 1) to be written in the memory cell through the data input storage unit 120. Accordingly, if logical levels of the two signals, that is, the phases thereof are compared and the phases are coincident with each other, the first comparing unit 500 can output the first detection signal (det1) that can be activated at a high level. However, if the phases of the two signals are not coincident with each other, the first comparing unit 500 can output the first detection signal (det1) that is inactivated at a low level. Accordingly, it can be determined whether a fail occurs between the data input buffer (refer to reference numeral 110 of FIG. 1) and the write driver (refer to reference numeral 130 of FIG. 1) among the write paths.

As shown in FIG. 4B, the second comparing unit 600 can be configured to receive the read expectation value (RDT) and the read data (rdt) and check whether the read expectation value (RDT) and the read data (rdt) are the same. The second comparing unit 600 can include a second exclusive NOR gate EXNOR2 and a second inverter INV2.

Specifically, the read expectation value (RDT) is a signal that can be synchronized with the data output clock signals (doclk_0) to (doclk_3) while the input data (Din) is latched, as described above. The read expectation value (RDT) is a signal that can be generated in consideration of the CAS latency (CL) and the burst length (BL) to correspond to the read data (rdt) read from the data sense amplifier (refer to reference numeral 310 of FIG. 1).

Accordingly, the read data (rdt), which can be read from the memory cell, can be compared with the read expectation value (RDT), and it can be checked whether the read data (rdt) and the read expectation value (RDT) are the same. Similar to the first comparing unit 500, if logical levels of the two signals, that is, the phases thereof are compared and the phases are coincident with each other, then the second comparing unit 600 can output the second detection signal (det2) that is activated at a high level. However, if the phases of the two signals are not coincident with each other, the second comparing unit 600 can output the second detection signal (det2) that is inactivated at a low level. It can then be determined whether a fail occurs between the write driver (refer to reference numeral 130 of FIG. 1) and the data sense amplifier (refer to reference numeral 310 of FIG. 1).

That is, when the read expectation value and the read data (rdt) are different from each other, it can be required to check whether a fail occurs on all paths in a conventional process. However, according to embodiments described herein, the range of failure paths can be separated and the expectation value data can be generated. That is, the read expectation value and the write expectation value can be generated. The read expectation value and the write expectation value can be compared with the read data and the write data, and thus, the possible failure paths can be separated, which makes it possible to narrow the range of possible failure paths. Accordingly, a fail path analysis time can be reduced. While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A semiconductor integrated circuit, comprising:
a data register that receives input data to generate and store a write expectation value and a read expectation value, during a period in which a test mode is activated;
a first comparing unit that compares write data written in a memory cell with the write expectation value; and
a second comparing unit that compares read data read from the memory cell with the read expectation value,
wherein the first and second comparing units are coupled with the data register to be simultaneously driven according to a test mode signal.

2. The semiconductor integrated circuit of claim 1,
wherein the data register comprises:
a first expectation value storage unit that receives a test mode activation signal and the input data to output the write expectation value; and
a second expectation value storage unit that receives the test mode activation signal, the input data, data input clock signals, and data output clock signals to output the read expectation value.

3. The semiconductor integrated circuit of claim 2,
wherein the first expectation value storage unit comprises a delayer, and the first expectation value storage unit delays the input data to align a comparing timing between the input data and the write data.

4. The semiconductor integrated circuit of claim 2,
wherein the second expectation value storage unit comprises a plurality of latch units, each of which latches the input data synchronized with the data input clock signal and outputs the input data synchronized with the data output clock signal.

5. The semiconductor integrated circuit of claim 1,
wherein the first comparing unit outputs an activated first detection signal, when the write data and the write expectation value are coincided with each other.

6. The semiconductor integrated circuit of claim 1,
wherein the second comparing unit outputs an activated second detection signal, when the read data and the read expectation value are coincided with each other.

7. A semiconductor integrated circuit, comprising:
a data register that receives input data provided from a data input buffer to generate and store a write expectation value and a read expectation value, during a period in which a test mode is activated;
a first comparing unit that compares the write expectation value with write data received to a write driver to output a first detection signal, thereby detecting whether a fail occurs on a path between the data input buffer and the write driver according to a logic level of the first detection signal; and
a second comparing unit that compares the read expectation value with read data provided from a data sense amplifier to output a second detection signal, thereby detecting whether a fail occurs on a path between the write driver and the data sense amplifier according to a logic level of the second detection signal,
wherein the first and second comparing units are coupled with the data register to be simultaneously driven according to a test mode signal.

8. The semiconductor integrated circuit of claim 7,
wherein the data register comprises:
a first expectation value storage unit that receives a test mode activation signal and the input data to output the write expectation value; and
a second expectation value storage unit that receives the test mode activation signal, the input data, data input clock signals, and data output clock signals to output the read expectation value.

9. The semiconductor integrated circuit of claim 8,
wherein the first expectation value storage unit comprises a delayer that aligns comparison timing between the input data and the write data.

10. The semiconductor integrated circuit of claim 8,
wherein the second expectation value storage unit comprises a plurality of latch units, each of which latches the input data synchronized with the data input clock signal and outputs the input data synchronized with the data output clock signal.

11. The semiconductor integrated circuit of claim 7,
wherein the first comparing unit outputs the first detection signal activated, when the write data and the write expectation value are coincided with each other.

12. The semiconductor integrated circuit of claim 7,
wherein the second comparing unit outputs the second detection signal activated, when the read data and the read expectation value are coincided with each other.

13. A semiconductor integrated circuit, comprising:
a detecting block that receives input data and stores the input data as a write expectation value and a read expectation value when a test mode is activated, and detects fail occurrence in the semiconductor integrated circuit by comparing write data written in a memory cell with the write expectation value and determining whether the write data and the write expectation value are coincided with each other, and by comparing read data read from the memory cell with the read expectation value and determining whether the read data and the read expectation value are coincided with each other, thereby narrowing a fail analysis path range,
wherein the comparing of the write data and the comparing of the read data are simultaneously performed according to a test mode signal.

14. The semiconductor integrated circuit of claim 13,
wherein the detecting block comprises:
a data register that receives the input data to generate and store the write expectation value and the read expectation value, during a period in which the test mode is activated;
a first comparing unit that compares the write data written in the memory cell with the write expectation value; and
a second comparing unit that compares the read data read from the memory cell with the read expectation value.

15. The semiconductor integrated circuit of claim 14,
wherein the data register comprises:
a first expectation value storage unit that receives a test mode activation signal and the input data to output the write expectation value; and
a second expectation value storage unit that receives the test mode activation signal, the input data, data input clock signals, and data output clock signals to output the read expectation value.

16. The semiconductor integrated circuit of claim 15,
wherein the first expectation value storage unit comprises a delayer, and
the first expectation value storage unit delays the input data to align comparison timing between the input data and the write data.

17. The semiconductor integrated circuit of claim 15,
wherein the second expectation value storage unit comprises a plurality of latch units, each of which latches the input data synchronized with the data input clock signal and outputs the input data synchronized with the data output clock signal.

18. The semiconductor integrated circuit of claim 14,
wherein the first comparing unit outputs an activated first detection signal, when the write data and the write expectation value are coincided with each other.

19. The semiconductor integrated circuit of claim 14,
wherein the second comparing unit outputs an activated second detection signal, when the read data and the read expectation value are coincided with each other.

20. A method of detecting a fail path of a semiconductor integrated circuit, the method comprising:
receiving input data and generating a write expectation value and a read expectation value, during a period in which a test mode is activated;
comparing write data written in a memory cell with the write expectation value to output a first detection signal, thereby determining whether a fail occurs; and
comparing read data read from the memory cell with the read expectation value to output a second detection signal, thereby determining whether a fail occurs,
wherein the comparing of the write data and the comparing of the read data are simultaneously performed according to a test mode signal.

21. The method of claim 20,
wherein the input data is a signal that is provided by a data input buffer,
the write data is a signal that is received to a write driver, and
the read data is a signal that is provided from a data sense amplifier.

22. The method of claim 21,
wherein, when the write expectation value and the write data are not coincided with each other, the first detection signal, which is inactivated, is output.

23. The method of claim 22,
wherein the inactivated first detection signal indicates that a fail exists on a path between the data input buffer and the write driver.

24. The method of claim 21,
wherein, when the read expectation value and the read data are not coincided with each other, the second detection signal, which is inactivated, is output.

25. The method of claim 24,
wherein the inactivated second detection signal indicates that a fail exists on a path between the write driver and the data sense amplifier.

* * * * *